United States Patent
Hoffmann et al.

(10) Patent No.: US 6,271,618 B1
(45) Date of Patent: Aug. 7, 2001

(54) METHOD AND CONFIGURATION FOR DRIVING A CAPACITIVE ACTUATOR

(75) Inventors: Christian Hoffmann, Regensburg; Hellmut Freudenberg, Grossberg; Hartmut Gerken, Nittendorf, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/408,683

(22) Filed: Sep. 30, 1999

(30) Foreign Application Priority Data

Sep. 30, 1998 (DE) .............................. 198 45 037

(51) Int. Cl.⁷ .................................... H01L 41/04
(52) U.S. Cl. ...................................... 310/316.03
(58) Field of Search .............. 310/316.03, 317, 310/316.01

(56) References Cited

U.S. PATENT DOCUMENTS

| | | | |
|---|---|---|---|
| 4,732,129 | * 3/1988 | Takigawa et al. | 123/478 |
| 4,767,959 | * 8/1988 | Sakakibara et al. | 310/317 |
| 5,053,668 | * 10/1991 | Mitsuyasu | 310/317 |
| 5,057,734 | * 10/1991 | Tsuzuki et al. | 310/317 |
| 5,204,576 | * 4/1993 | Mitsuyasu | 310/317 |
| 5,208,505 | * 5/1993 | Mitsuyasu | 310/317 |
| 5,214,340 | * 5/1993 | Suzuki | 310/316 |
| 5,543,679 | * 8/1996 | Morino et al. | 310/316 |
| 5,986,360 | * 11/1999 | Gerken et al. | 307/125 |
| 6,016,040 | * 1/2000 | Hoffmann et al. | 318/116 |
| 6,060,814 | * 5/2000 | Hoffmann et al. | 310/316.03 |
| 6,078,198 | * 6/2000 | Gerken et al. | 327/111 |
| 6,081,062 | * 6/2000 | Hoffmann et al. | 310/316.03 |
| 6,121,715 | * 9/2000 | Hoffmann et al. | 310/316.03 |
| 6,133,714 | * 10/2000 | Hoffmann et al. | 320/166 |
| 6,137,208 | * 10/2000 | Hoffmann et al. | 310/316.03 |
| 6,147,433 | * 11/2000 | Reineke et al. | 310/316.03 |
| 6,157,174 | * 12/2000 | Hoffmann et al. | 320/166 |

FOREIGN PATENT DOCUMENTS

| | | |
|---|---|---|
| 847778 | 8/1952 | (DE) . |
| 19652807A1 | 6/1998 | (DE) . |
| 1965366A1 | 7/1998 | (DE) . |
| 0126846A2 | 12/1984 | (EP) . |

* cited by examiner

Primary Examiner—Nestor Ramirez
Assistant Examiner—Peter Medley
(74) Attorney, Agent, or Firm—Herbert L. Lerner; Laurence A. Greenberg; Werner H. Stemer

(57) ABSTRACT

In a driving configuration for driving an actuator, component tolerances are compensated for by measuring a discharging current flowing in a measuring branch and the discharging voltage during a charge-transfer (reversing) operation. The measuring branch contains a series resonance circuit having a charging capacitor, a coil, an auxiliary switch and a measuring resistor. The current and voltage values measured at various instants are evaluated; and from them, initial parameters are determined for the subsequent driving operations.

11 Claims, 4 Drawing Sheets

METHOD AND CONFIGURATION FOR DRIVING A CAPACITIVE ACTUATOR

BACKGROUND OF THE INVENTION:

Field of the Invention

The invention concerns a method and a configuration for driving an actuator, in particular a piezoelectrically operated fuel injection valve of an internal combustion engine.

Published, Non-Prosecuted German Patent Application DE 196 53 666 A1 discloses a method for quickly driving capacitive loads in which a control circuit is controlled by a control device. In this method, the interaction of an upward and downward controller in the control circuit and an evaluation of a load voltage and load current values together with a fast digital controller make it possible to produce to a great extent any desired voltage characteristics at the capacitive load.

Published, Non-Prosecuted German Patent Application DE 196 52 807 A1 discloses transferring predeterminable energy to an actuator by transferring the charge of a charging capacitor partially to the actuator via a ring-around coil. A deviation in the metered amount of energy supplied in a driving operation is established on the basis of a family of characteristic maps or fields and is corrected incrementally in the next driving operations. The family of characteristic maps are determined experimentally from the predetermined component values of the configuration and the temperature-dependent actuator capacitance.

This method of driving an actuator presupposes that the capacitance of the charging capacitor and the inductance of the ring-around coil are precisely known. However, coils and capacitors usually have production-related tolerances of approximately ±10%; in addition, their values change during operation in dependence on temperature and aging. By measuring an inductance and a capacitance at the end of the line, component tolerances can be detected and taken into account in the driving method. A further solution is to use components with low production tolerances, which however leads to high component prices. External influences during operation, such as temperature influences or aging of the components for example, are not taken into account in the two solutions.

SUMMARY OF THE INVENTION

It is accordingly an object of the invention to provide a method and a configuration for driving a capacitive actuator which overcome the above-mentioned disadvantages of the prior art methods and devices of this general type, in which component tolerances of the driving circuit are detected and compensated for.

With the foregoing and other objects in view there is provided, in accordance with the invention, a method for driving a capacitive actuator being driven by a driving circuit having a series resonance circuit with a charging capacitor and a coil, the method compensating for component tolerances of the driving circuit, which includes:
reversing a charge of the charging capacitor, previously charged to a predetermined calibrating voltage, via the coil and detecting current values of a flowing charge-transfer current at different instants;
determining a charging capacitance of the charging capacitor and an inductance of the coil from the predetermined calibrating voltage, the different instants and the current values with an aid of laws applicable in series resonance circuits;
determining a starting voltage and a charging time from a predeterminable energy, the charging capacitance and the inductance on a basis of characteristic maps; and
transferring the predeterminable energy to the capacitive actuator by the charging capacitor charged to the starting voltage and having its charge transferred during the charging time to the capacitive actuator.

With the foregoing and other objects in view there is further provided, in accordance with the invention, a driving circuit that self-compensates for component tolerances of components of the driving circuit, including:
a series circuit having a charging capacitor with a charging capacitance, a coil having an inductance disposed in series with the charging capacitor, and an adjuster circuit disposed in series with the coil and has an actuator;
a main switch connected to the charging capacitor and to be connected to an energy source is provided for supplying the charging capacitor via the main switch;
a switching branch disposed in parallel with the adjuster circuit and has an auxiliary switch and a measuring resistor connected to the auxiliary switch;
the charging capacitor, the coil and the switching branch form a measuring branch; and
a controller connected to the series circuit and the main switch perform the above-noted operating steps.

The essential idea of the invention is to carry out in the measuring branch of the configuration, having the charging capacitor, the ring-around coil and the switching branch with a switch, an LC measuring operation. The LC measuring operation includes carrying out a charge-transfer (reversal) operation in the measuring branch and, during this operation, recording in the measuring branch current and voltage measurements, for subsequently determining capacitance and inductance values, and using the values determined for subsequent driving of the actuator.

A major advantage is that low-cost capacitors and coils with high tolerances can be used in the configuration. Furthermore, the service life of the configuration increases, since age-dependent influences are compensated. The range of use of the configuration is extended, since temperature-related influences are also compensated for.

Other features which are considered as characteristic for the invention are set forth in the appended claims.

Although the invention is illustrated and described herein as embodied in a method and a configuration for driving a capacitive actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
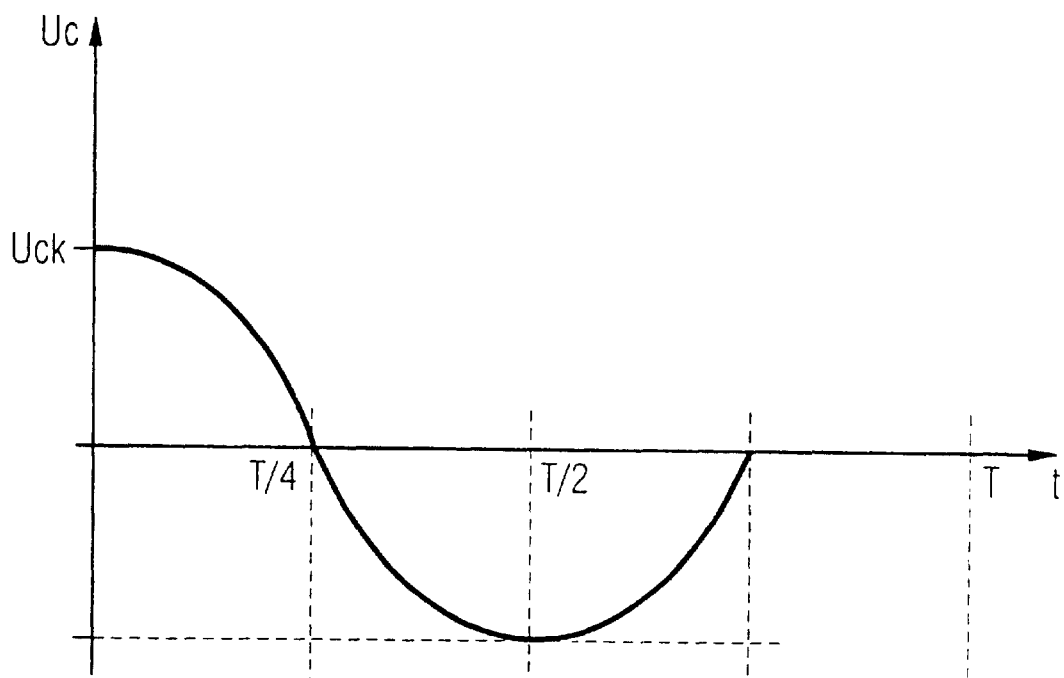
FIGS. 1a and 1b are diagrammatic, graphs representing current and voltage characteristics during a charge-transfer operation according to the invention.
Figure 1B:
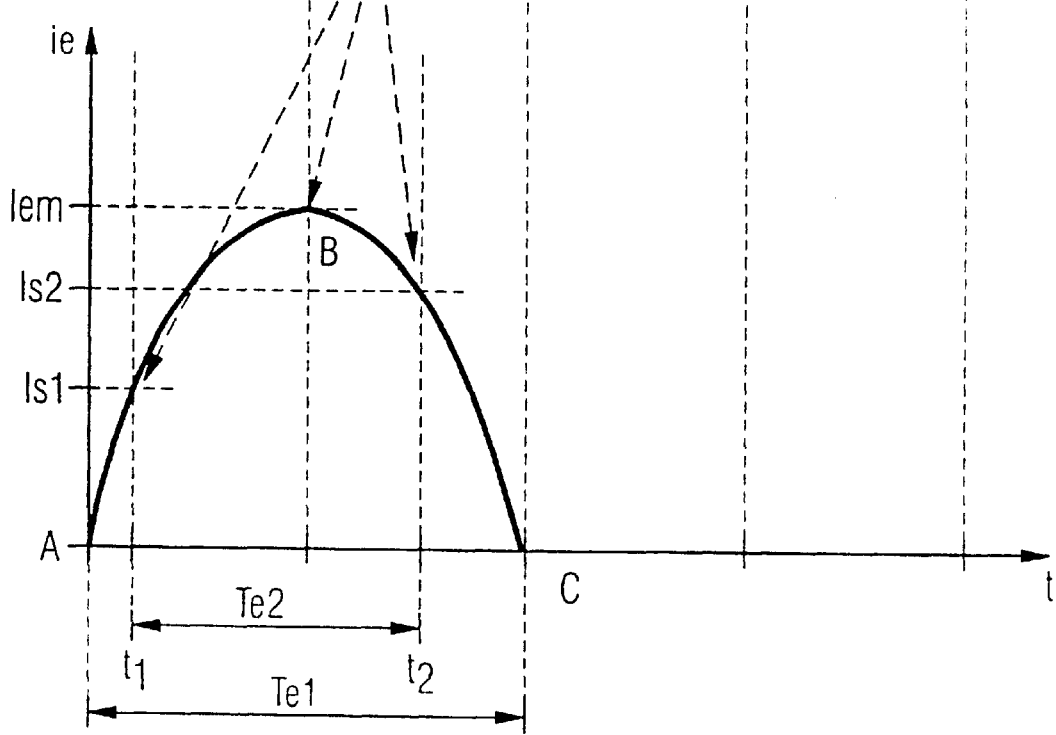

In all the figures of the drawing, sub-features and integral parts that correspond to one another bear the same reference symbol in each case. Referring now to the figures of the drawing in detail and first, particularly, to FIGS. 1a and 1b thereof, there is shown a charge-transfer (reversal) operation. Current and voltage characteristics of the charge-transfer operation are represented in the diagrams of FIGS. 1a and 1b. A driving of one or more fuel injection valves of an internal combustion engine via an actuator P, preferably a piezoelectric final control element, take place in the configuration according to FIG. 2. The actuator P is driven by a control device ST according to FIG. 3, which may be part of a microprocessor-controlled engine control device (not represented any further). The operating steps proceeding in the control device ST are explained in FIG. 4.

Figure 2:
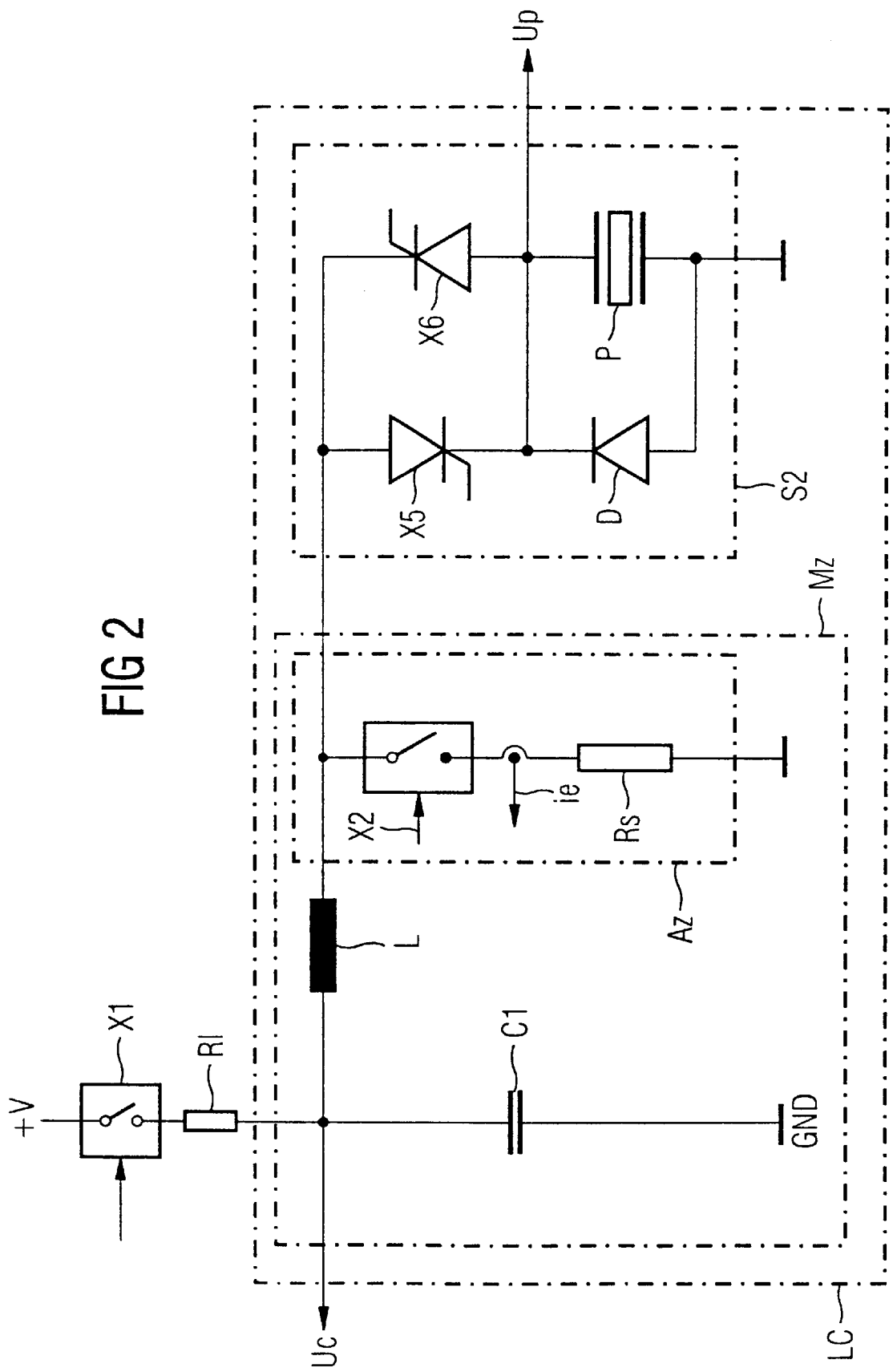
FIG. 2 is a block diagram of an actuator driving circuit.

In the circuit represented in FIG. 2, an LC measuring operation is initiated by beginning a charge-transfer operation, i.e. a charging capacitor C1 that is charged via a main switch X1 and a charging resistor R1 to a predetermined calibrating voltage Uck has its charge transferred by a ring-around coil L via a switching branch Az, until the charging capacitor C1 is charged to a capacitor voltage Uc which approximately corresponds to the calibrating voltage with an opposite polarity −Uck. A series resonance circuit containing the charging capacitor C1, the ring-around coil L and the switching branch Az is referred to in the following text as a measuring branch Mz, the switching branch Az having a series connection containing an auxiliary switch X2 and a measuring resistor Rs.

In further exemplary embodiments, not described in any more detail in the figures, the charging capacitor C1 can be extended by a network having a plurality of capacitors and switches with an equivalent capacitance.

The diagrams in FIGS. 1a and 1b show the current and voltage characteristics during a charge-transfer (reversing) operation with components assumed to be loss-free. FIG. 1a shows the voltage characteristic of the capacitor voltage Uc at the charging capacitor C1, FIG. 1b shows the current characteristic of the charge-transfer current ie in the measuring branch Mz. The measuring branch Mz represents a series resonance circuit with a period T.

The charge-transfer operation of the charging capacitor C1 charged to the calibrating voltage Uck starts at the instant t=0 with the auxiliary switch X2 being switched to a conducting state. At the instants t=0; t=T/4; and t=T/2, the current and voltage values in the measuring branch Mz for the resonance circuit assumed to be loss-free are:
instant A: t=0: Uc=Uck; ie=0,
instant B t=T/4: Uc=0; ie=Iem, and
instant C t=T/2: Uc=−Uck; ie=0.

The charge-transfer operation may be continued beyond the instant C in the form of further oscillations until the auxiliary switch X2 is closed, preferably at one of the instants n*(T/2), n=1,2,3, . . . , at which the charge-transfer current ie is equal to 0 and consequently no voltage overshoot is produced by the ring-around coil L.

Values of the charge-transfer current ie are recorded at different instants ti, preferably at the instants A, B and C, the difference A−C being referred to in the following text as the first oscillating time Te1. Using the laws applicable in series resonance circuits, a capacitance Kc of the charging capacitor C1 and an inductance IL of the ring-around coil L are determined. The capacitance Kc and the inductance IL are calculated by evaluating the measured values, preferably recorded at the instants A, B and C, by applying the laws occurring in the measuring branch Mz and represented in equations (1) and (2).

$$C1 = Iem*(T/2)/(Uck*PI) \quad (1)$$

$$L = Uck*(T/2)/(Iem*PI) \quad (2)$$

Measuring points may also be detected at other instants, the equations (1) and (2) being correspondingly adapted. For example, the measuring points Mi, which are represented in FIG. 1b and represent the charge-transfer current ie flowing at the instants t1, T/2 and t2 with the first and second current values Is1, Is2 and the maximum current Iem, may be detected, the difference t2−t1 being referred to in the following text as a second oscillating time Te2.

The components in the measuring branch Mz have ohmic resistances, which lead to losses during the charge-transfer operation and consequently to an attenuation of amplitudes of the capacitor voltage Uc and the charge-transfer current ie. The amount of the attenuation and of the change in the period T is dependent on the ohmic resistances of the components and corresponds to the laws known in attenuated series resonance circuits.

Dependent on the amount of attenuation to be expected and on the measuring accuracy, the capacitor voltage Uc is measured at one of the instants n*(T/2), n=1,2,3, . . . and its deviation from the calibrating voltage Uck is determined, from which the amount of attenuation is concluded with the aid of the laws mentioned above.

The sizes of the components in the measuring branch Mz and their ohmic resistances may be represented in an equivalent circuit diagram by components which are assumed to be loss-free and by an equivalent resistance which is inserted into the measuring branch Mz and represents the entirety of the ohmic resistances.

Figure 3:
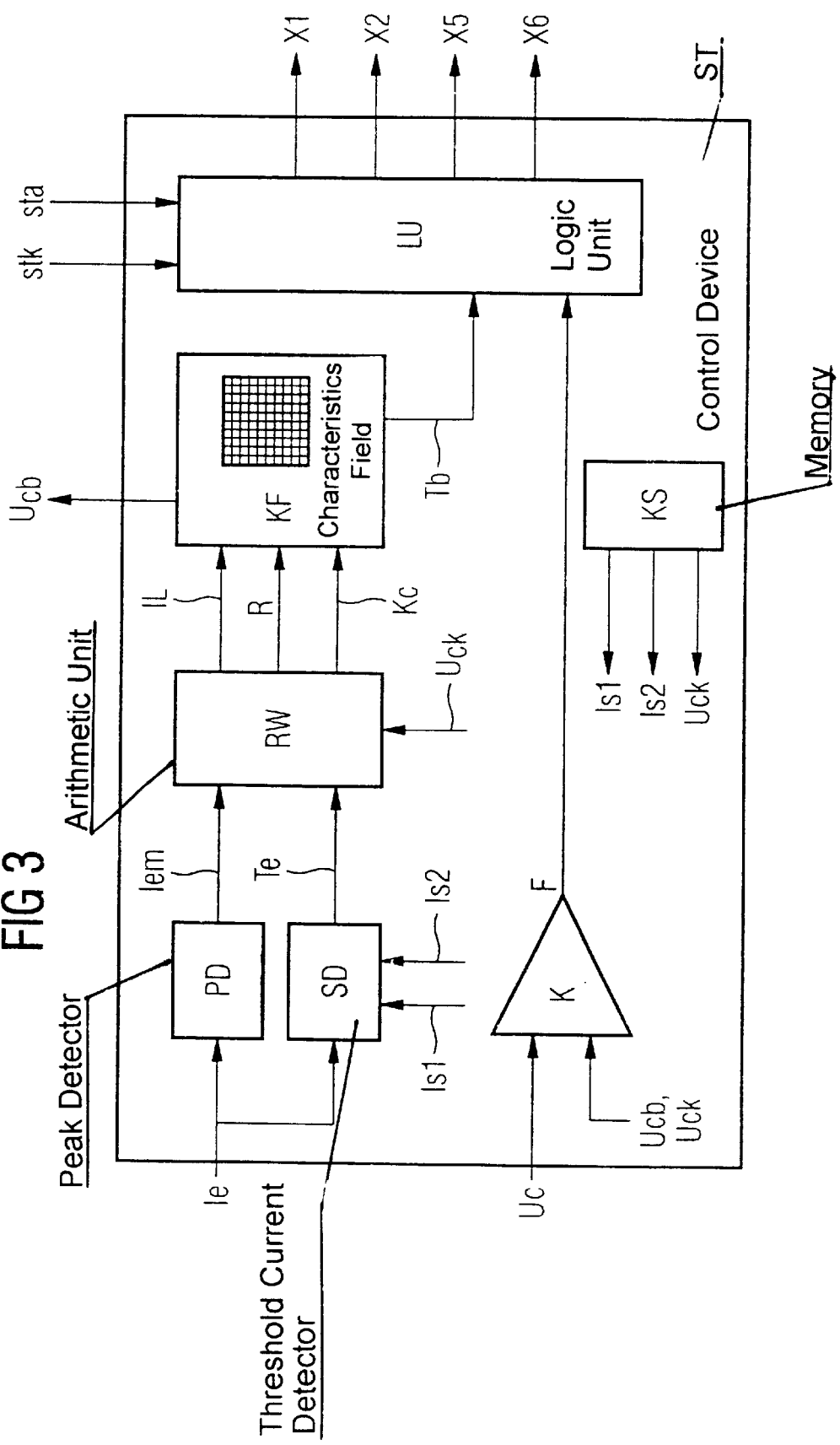
FIG. 3 is a block diagram of a control device which is connected to the actuator driving circuit according to FIG. 2.

The voltage and current characteristics represented in FIGS. 1a and 1b are detected and evaluated by the configurations represented in FIG. 2 and FIG. 3.

FIG. 2 shows a basic circuit in the form of a series circuit LC for performing the LC measuring operation and for driving a fuel injection valve of an internal combustion engine via the actuator P, the series circuit being controlled by the control device ST represented in FIG. 3.

In FIG. 2, the charging capacitor C1 is connected to an energy source V via the switch X1 and the charging resistor R1. Parallel to the charging capacitor C1 is a series connection containing the ring-around coil L, connected to the main switch X1 via the charging resistor R1, and the switching branch Az, which has a series connection containing the auxiliary switch X2 and the measuring resistor Rs. Parallel to the switching branch Az is an adjuster S2, which has a series connection containing:

a parallel connection of a charging switch X5 that is conductive in a direction away from the ring-around coil L and a discharging switch X6 that is conductive in a direction toward the ring-around coil L, and a parallel connection of the actuator P with a diode D that is conductive in a direction away from a negative pole GND of the energy source V.

The ohmic resistances of the charging capacitor C1, of the ring-around coil L and of the auxiliary switch X2 can be combined as described above to form an equivalent resistance.

The equivalent resistance is dependent on the temperature and the age of the components. The switches X1 to X6 are semiconductor components, the ohmic resistance of which is strongly temperature-dependent and is incorporated in the equivalent resistance. Since switches X1 to X6 have approximately the same temperature during operation, he ohmic resistances of the charging switch X5 and of the discharging switch X6 can be determined indirectly in dependence on the equivalent resistance.

The measuring resistor Rs is preferably rated such that it is negligible or so precisely rated that it can be compensated for by calculations.

The switches X1 to X6 are controlled by the control device ST, which is shown in FIG. 3.

The control device ST stores the predetermined values of the calibrating voltage Uck and the predeterminable current values Is1, Is2 in a value memory KS. The control device ST has a peak detector PD, in which the maximum current Iem of the charge-transfer current ie supplied to the peak detector is detected. The control device ST further has a threshold current detector SD, which determines the oscillating times Te1 or Te2 by detecting the instants at which the charge-transfer current ie overshoots or undershoots the predeterminable current values Is1, Is2. A comparator K compares the supplied capacitor voltage Uc with the calibrating voltage Uck or a starting voltage Ucb is provided in the control device ST and outputs an output signal F. An arithmetic unit RW is also provided in the control device ST, which determines the capacitance Kc and the inductance IL from the predeterminable current value Is2, Is1, the predetermined calibrating voltage Uck and the oscillating time Te1 or Te2. A family of characteristic maps KF, in which the starting voltage Ucb and a charging time Tb are determined from the charging capacitance Kc, the predeterminable energy E and the inductance IL. A charge-transfer duration tp is equal to a charge-transfer duration tp of the charge transfer from the charging capacitor C1 to the actuator P. Finally, the control device ST has a logic unit LU, which processes a supplied driving signal sta, a supplied measuring control signal stk, the output signal F of the comparator K and the value of the charging time Tb in a program-controlled manner and drives the switches X1 to X6 according to the operating steps performed in FIG. 4.

Figure 4:
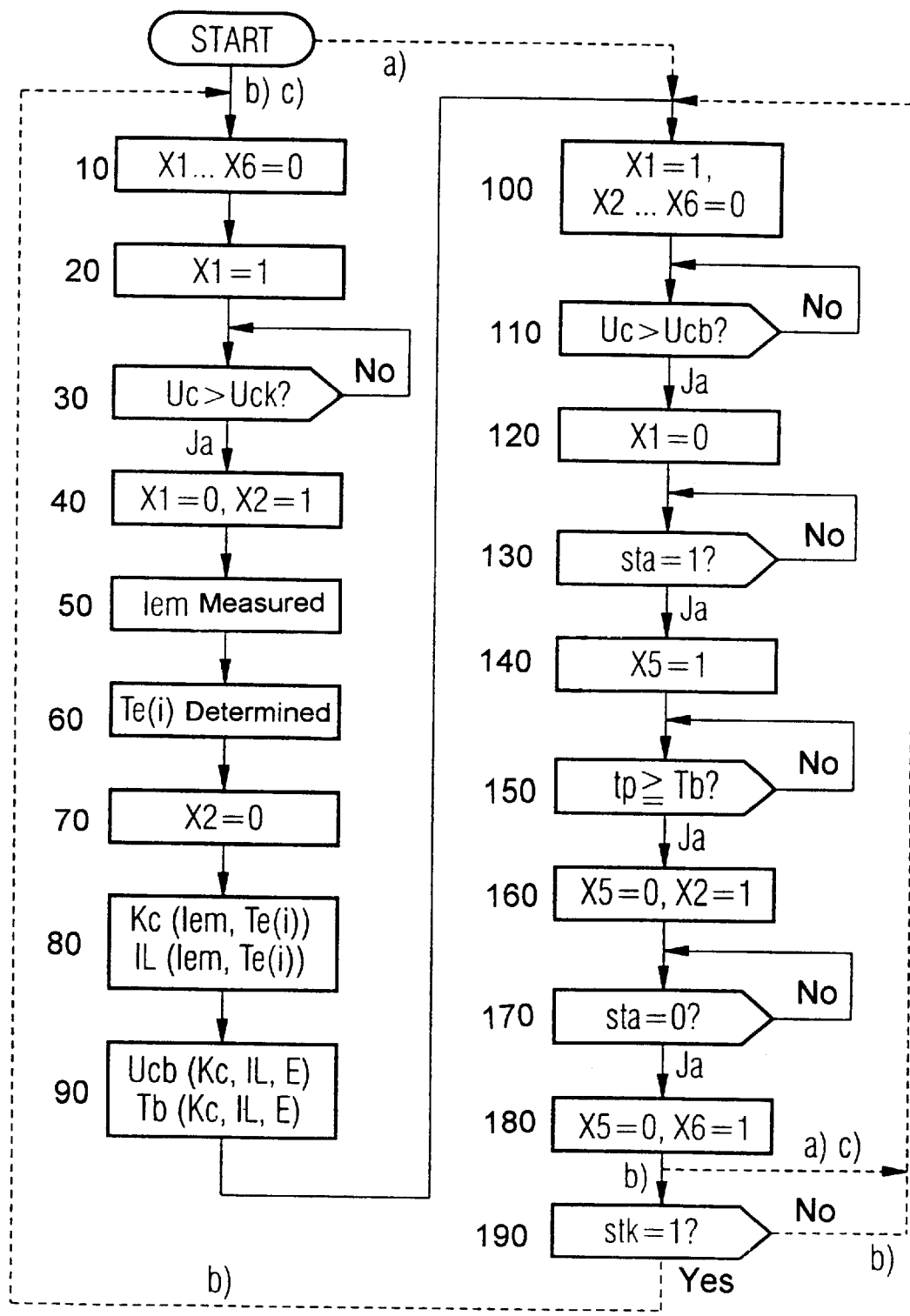
FIG. 4 is a flow chart, concerning operating steps of the actuator driving circuit according to FIGS. 2 and 3.

In FIG. 4, the operating steps proceeding in the exemplary embodiments of FIG. 2 and FIG. 3 are presented in a flow diagram. The operating steps 10 to 90 represent the LC measuring operation, and steps 100 to 180 represent a driving operation of the actuator P. The driving operation may also proceed according to other methods, not presented any further in the figures. The individual operating steps are presented below.

Step 10—The switches X1 to X6 are not conducting at the beginning of the operating steps.

Step 20—The LC measuring operation begins with the charging of the charging capacitance C1, via the main switch X1 in a conducting state and the charging resistor R1, to a predetermined calibrating voltage Uck.

Steps 30 and 40—After reaching the predetermined calibrating voltage Uck, the main switch X1 becomes nonconducting, whereby the charging operation is stopped. The charge-transfer (reversing) operation begins by the auxiliary switch X2 being switched to a conducting state, whereby the charging capacitor C1 has its charge transferred via the ring-around coil L and the switching branch Az.

Step 50—The maximum current Iem is measured.

Step 60—The oscillating time Te1 or Te2 (Te(i)) is determined.

Step 70—The charge-transfer operation is ended, the auxiliary switch X2 becomes nonconducting. The auxiliary switch preferably becomes nonconducting when the charge-transfer current ie=0, in order to avoid voltage overshoots through the inductance IL of the coil L.

Step 80—The capacitance Kc and the inductance IL are determined by use of the laws mentioned in formulas (1) and (2).

Step 90—The initial parameters, the starting voltage Ucb and the charging time Tb, are determined from the capacitance Kc, the predetermined energy E and the inductance IL with the aid of the characteristic maps KF of the control device ST.

Step 100—The switches X2 to X6 are nonconducting at the beginning of the driving operation of the actuator P. The driving operation begins with the main switch X1 becoming conducting, whereby the charging of the charging capacitor C1 begins.

Steps 110 and 120—The main switch X1 becomes nonconducting when the starting voltage Ucb is reached or overshot, whereby the charging operation is ended.

Step 130—The external driving signal sta initiates the driving operation of the actuator P.

Step 140—The charging switch X5 becomes conducting, whereby the charging capacitor C1, charged to the starting voltage Ucb, has its charge transferred during the charging duration tp to the actuator P.

Steps 150 and 160—When the charging duration tp reaches the previously determined charging time Tb, the auxiliary switch X2 becomes conducting and the charging switch X5 is blocked (non-conducting), whereby the charging operation of the actuator P is ended. Any residual charge there may be in the charging capacitor C1 is transferred in the measuring branch Mz into C1. The charged actuator P brings about an injection operation in the fuel injection valve. After the end of the charging operation, the actuator voltage Up is measured and evaluated for the subsequent driving operations, as explained in Published, Non-Prosecuted German Patent Application DE 196 52 807 A1.

Step 170—The external final-control-element control signal sta initiates the end of the injection operation.

Step 180—The auxiliary switch X2 becomes nonconducting, the discharging switch X6 becomes conducting, the charge of the actuator P is transferred into the charging capacitor C1 and the charge of the charging capacitor C1 is transferred via the diode D, the discharging switch X6 and the ring-around coil L into C1.

Step 190—Driving by the external measuring control signal stk initiates a new LC measuring operation.

The dashed lines in FIG. 4 indicate further exemplary embodiments of the invention, including:

a) before and after a driving operation of the actuator P, no LC measuring operation is initiated; the LC measuring operation may have taken place for example at the end of the line, as performed in item c);

b) dependent on the external measuring control signal stk and driving signal sta, the LC measuring operation or a further driving operation of the actuator P is initiated;

c) an LC measuring operation is performed only once directly after starting; and d) at least one LC measuring operation has already taken place in production, for example at the end of the line.

All conceivable, appropriate combinations of a), b), c) and d) serve as further exemplary embodiments.

In a further embodiment, attenuation of the amplitudes of the capacitor voltage Uc and the charge-transfer current ie are taken into account by the ohmic resistances of the components of the measuring branch Mz, ohmic resistances being combined in an equivalent circuit to form an equivalent resistance, as represented in the description of FIGS. 1a and 1b. The capacitor voltage Uc is measured preferably in parallel with the operating steps 50 and 60 at one of the instants n*(T/2), n=1,2,3, . . . . Depending on the deviation of the capacitor voltage Uc from the calibrating voltage Uck, the maximum current Iem and the oscillating time Te1 or Te2 (Te(i)), the charging capacitance Kc, the inductance IL and the equivalent resistance, on which the initial parameters Ucb and Tb determined in the working step 90 and consequently the accuracy of the metered amount of energy supplied are dependent, are then calculated in the operating step 80.

In a further embodiment, instead of the measurement of the maximum current Iem, some other measured value is determined, either measuring a value of the charge-transfer current ie at a predeterminable instant or measuring an instant at a predeterminable value of the charge-transfer current ie. In the working step 80, the inductance IL, the charging capacitance Kc and preferably also the equivalent resistance are then correspondingly determined with the aid of formulas adapted to the other measured value and representing the laws of a series resonance circuit.

We claim:

1. A method for driving a capacitive actuator being driven by a driving circuit having a series resonance circuit with a charging capacitor and a coil, the method compensating for component tolerances of the driving circuit, which comprises:

reversing a charge of the charging capacitor previously charged to a predetermined calibrating voltage, via the coil and detecting current values of a flowing charge-transfer current at different instants;

determining a charging capacitance of the charging capacitor and an inductance of the coil from the predetermined calibrating voltage, the different instants and the current values with an aid of laws applicable in series resonance circuits;

determining a starting voltage and a charging time from a predeterminable energy, the charging capacitance and the inductance on a basis of characteristic maps; and transferring the predeterminable energy to the capacitive actuator by the charging capacitor charged to the starting voltage and having its charge transferred during the charging time to the capacitive actuator.

2. The method according to claim 1, which comprises:

reversing the charge of the charging capacitor, previously charged to the predetermined calibrating voltage, via the coil and detecting the current values of the flowing charge-transfer current at the different instants, and detecting a capacitor voltage of the charging capacitor at a further instant; and determining the charging capacitance of the charging capacitor and the inductance of the coil from the predetermined calibrating voltage, the different instants, the current values and a deviation of the capacitor voltage from the predetermined calibrating voltage with the aid of the laws applicable in series resonance circuits.

3. The method according to claim 1, which comprises determining the charging capacitance of the charging capacitor, the inductance of the coil and an equivalent resistance from the predetermined calibrating voltage, the different instants, the current values and a deviation of the capacitor voltage from the predetermined calibrating voltage with the aid of the laws applicable in series resonance circuits.

4. The method according to claim 1, which comprises detecting some of the different instants by a comparison of the charge-transfer current with predeterminable current values.

5. The method according to claim 1, which comprises determining the characteristics maps experimentally by recording characteristic curves for different values of the inductance, of the charging capacitance, and of switches contained in the driving circuit, and storing the different values in the control device as the characteristic maps.

6. The method according to claim 1, which comprises:

detecting a capacitor voltage of the charging capacitor at a further instant during the reversing step; and using a deviation of the capacitor voltage from the predetermined calibrating voltage for assisting in determining the charging capacitance of the charging capacitor and the inductance of the coil.

7. The method according to claim 1, which comprises determining an equivalent resistance of the charging capacitor and the coil from the predetermined calibrating voltage, the different instants, the current values and a deviation of the capacitor voltage from the predetermined calibrating voltage with the aid of the laws applicable in series resonance circuits.

8. A driving circuit that self-compensates for component tolerances of components of the driving circuit, comprising:

a series circuit having a charging capacitor with a charging capacitance, a coil having an inductance disposed in series with said charging capacitor, and an adjuster circuit disposed in series with said coil and having an actuator;

a main switch connected to said charging capacitor and to be connected to an energy source for supplying said charging capacitor via said main switch;

a switching branch disposed in parallel with said adjuster circuit of said series circuit and having an auxiliary switch and a measuring resistor connected to said auxiliary switch;

said charging capacitor, said coil and said switching branch forming a measuring branch; and a controller connected to said series circuit and said main switch for performing the following operating steps:

reversing a charge of said charging capacitor, previously charged to a predetermined calibrating voltage, via said coil and detecting current values of a flowing charge-transfer current at different instants;

determining said charging capacitance of said charging capacitor and said inductance of said coil from the predetermined calibrating voltage, the different instants and the current values with an aid of laws applicable in series resonance circuits;

determining a starting voltage and a charging time from a predeterminable energy, said charging capacitance and said inductance on a basis of characteristic maps; and transferring the predeterminable energy to said actuator by said charging capacitor charged to the starting voltage and having its charge transferred during the charging time to said actuator.

9. The driving circuit according to claim 8, wherein said controller, includes:

a memory storing values of the predetermined calibrating voltage and the current values;

an arithmetic unit for determining said charging capacitance and said inductance from the current values, the predetermined calibrating voltage and an oscillating time supplied to said arithmetic unit;

a comparator outputting an output signal; and a logic unit for processing a supplied driving signal, a supplied measuring control signal, the output signal supplied by said comparator and the charging time in a program-controlled manner, said logic unit driving said main switch, said auxiliary switch and said adjuster circuit having further switches.

10. The driving circuit according to claim 9, wherein said controller further includes:

a peak detector for detecting a maximum current of the charge-transfer current and connected to said arithmetic unit;

a threshold current detector in which the different instants, at which the charge-transfer current assumes predeterminable current values, are determined; and said comparator compares a capacitor voltage of said charging capacitor with the predetermined calibrating voltage.

11. The driving circuit according to claim 9, wherein said controller further includes:

a peak detector for detecting a maximum current of the charge-transfer current and connected to said arithmetic unit;

a threshold current detector in which the different instants, at which the charge-transfer current assumes predeterminable current values, are determined; and said comparator compares a capacitor voltage of said charging capacitor with the starting voltage.

* * * * *